United States Patent [19]
Hammerschmidt et al.

[11] Patent Number: 5,601,902
[45] Date of Patent: Feb. 11, 1997

[54] MULTILAYER PRINTED CIRCUIT BOARDS AND MULTICHIP-MODULE SUBSTRATES, WITH LAYERS OF AMORPHOUS HYDROGENATED CARBON

[75] Inventors: Albert Hammerschmidt, Erlangen; Siegfried Birkle, Hoechstadt, both of Germany

[73] Assignee: Siemens Aktiengesellschaft, München, Germany

[21] Appl. No.: 443,298

[22] Filed: May 17, 1995

[30] Foreign Application Priority Data

May 20, 1994 [DE] Germany ............... 44 17 775.5

[51] Int. Cl.⁶ .................................................. B32B 9/00
[52] U.S. Cl. ..................... 428/209; 428/901; 361/748
[58] Field of Search .................... 428/422, 209, 428/210, 901; 430/58; 526/282; 361/748

[56] References Cited

U.S. PATENT DOCUMENTS

| | | | |
|---|---|---|---|
| 4,977,008 | 12/1990 | Squire | 428/422 |
| 5,139,906 | 8/1992 | Doi | 430/58 |
| 5,399,646 | 3/1995 | Kohara | 526/282 |

FOREIGN PATENT DOCUMENTS 0381109  8/1990  European Pat. Off.

OTHER PUBLICATIONS

"Multichip modules: next–generation packages", *IEEE Spectrum*, vol. 27 (1990), No. 3, pp. 24–48.
Reche, J. et al., "High Density Multichip Module Fabrication", *The International Journal for Hybrid Microelectronics*, vol. 13, No. 4, Dec. 1990, pp. 91–99.
Rüppel, D. et al., "Keramik/Metal/Polymer—Verbunde für Multilayer–Multichip–Module", *VDI Berichte*, No. 933 (1991), pp. 265–283.
von Dr. H. Ahne, "Photostrukturierbare Passivier–und Isolierschichten", *Fachtagung Polymerwerkstoffe für die Elekronik*, 14.–16. Oktober 1987, Würzburg, Tagungsbericht (1987), pp. 153–165.
Hammerschmidt, A. et al., "Electrical Properties and Water Absorption of Polyimides and Related Materials Under Controlled Conditions", *1st European Technical Symposium on Polyimides*, 10. bis 11, Mai 1989, Montpellier, Frankreich.

*Primary Examiner*—Patrick Ryan
*Assistant Examiner*—Patrick Jewik
*Attorney, Agent, or Firm*—Kenyon & Kenyon

[57] ABSTRACT

Multilayer printed circuit boards and multichip-module substrates having at least one layered composite of high-temperature-stable plastic and conductive tracks wherein the plastic is provided with a thin layer of amorphous, hydrogenated carbon (a—C:H) having a water permeation coefficient of $<1.1 \times 10^{-13}$ m²/s. The a—C:H-layer also has a hardness gradient across it.

2 Claims, No Drawings

MULTILAYER PRINTED CIRCUIT BOARDS AND MULTICHIP-MODULE SUBSTRATES, WITH LAYERS OF AMORPHOUS HYDROGENATED CARBON

BACKGROUND OF THE INVENTION

1. Field of the Invention

The invention relates to multilayer printed circuit boards and multichip-module substrates having at least one layered composite of high-temperature-stable plastic and conductive tracks, as well as to a method for their manufacture.

2. Description of Related Art

Multichip modules (MCM) are components which connect integrated circuits, such as memory and logic modules, to one another and to the peripheral units. The resulting shortened current paths permit shorter signal propagation delays and a higher clock frequency. The multichip modules are manufactured using multilayer technology, ceramic or silicon being suitable as substrate material. Also suitable as substrates are printed-circuit boards, which—in the same way as ceramic materials—can have a multilayer structure. The actual microcircuit wiring on the substrate (up to 25 conductor wiring layers and more) consists of copper conductors, which are insulated from one another by an organic dielectric material, such as polyimide. Via holes from one copper conductor layer to the next electrically connect the individual copper layers (see: "IEEE Spectrum", vol. 27 (1990), no. 3, pp. 34–36, 46 and 48; "The International Journal for Hybrid Microelectronics", vol. 13 (1990), no. 4, pp. 91–99; "VDI-Berichte" ["VDI Reports"], no. 933 (1991), pp. 265–283).

Due to their low dielectric constant, organic dielectric materials permit higher clock frequencies than ceramic insulation layers; however, higher clock frequencies will be required in the future more and more. High-temperature-stable organic polymers, such as polyimides and polybenzocyclobutenes, are primarily used, since they largely satisfy the electrical requirements (low dielectric constant, low loss angle) and the thermal requirements (stability during soldering processes).

High-temperature-stable organic dielectric materials, such as polyimides, have, however, the property of absorbing up to 4 mass % of water from the ambient humidity (see A. Hammerschmidt et al., 1st European Technical Symposium on Polyimides, May 10–11, 1989, Montpellier, France). As a consequence, the electrical properties, particularly the dielectric constant, are adversely affected. This, in turn, exacerbates the switching performance (clock frequency) of the entire subassembly. Furthermore, the moisture can initiate or accelerate corrosion processes inside the multichip modules.

At the present time, moisture barriers are not being applied to multichip modules having organic dielectric materials. A moisture barrier is not absolutely necessary because of encapsulation, packaging in air-conditioned areas, and layer thicknesses of up to 60 μm per layer. A protection of this type is actually necessary, however, for new design concepts with dielectric layer thicknesses of 15 to 20 μm per layer, as well as for low-cost applications.

In the case of integrated circuits formed in multilayer construction with organic dielectric materials (up to three conductor planes; the layer thickness of the dielectric material being from 1 to 2 μm)—in order to suppress dielectric fluctuations caused by variations in moisture—the planarizing dielectric materials are covered with a layer of silicon nitride, so-called plasma nitride, which acts as a moisture barrier (see: Fachtagung "Polymerwerkstoffe für die Elektronik" [Technical Conference "Polymer Materials for Electronics"], Oct. 14–16, 1987, Würzburg, Conference Report (1987), pp. 153–165). However, silicon nitride has the disadvantage of being brittle even at layer thicknesses below 0.25 μm. Moreover, a different etching process (fluoro etching) must be applied for the requisite structuring of the silicon nitride (to expose contact pads) than is used to structure the subjacent organic dielectric material, such as polyimide ($O_2$/RIE or wet etching).

To avoid the disadvantages associated with silicon nitride, it is already known to use amorphous, hydrogenated carbon as a coating in the case of integrated circuits (see European patent application Ser. No. 0 381 109 A2). In so doing, however, unfavorable effects can result from compressive stress.

SUMMARY OF THE INVENTION

The object of the invention is to provide multilayer printed circuit boards and multichip-module substrates, comprising plastic layers, of the general type discussed above, having an effective moisture barrier.

In accordance with the invention, this is achieved by providing the plastic with a thin layer of amorphous, hydrogenated carbon ("a—C:H") having a water permeation coefficient of $<1.1 \times 10^{-13}$ m$^2$/s. The a—C:H-layer has a hardness gradient to abate the unfavorable effect of compressive stress.

DETAILED DESCRIPTION OF THE INVENTION

The multilayer printed circuit boards and multichip-module substrates according to the invention have pinhole-free a—C:H layers, which are substantially impermeable to water and have intimate contact with the substrate. In addition, the a—C:H layers are distinguished by good adhesion to the high-temperature-stable polymers and can have specific conductivities of up to $10^{18}$ Ω·cm, as well as an optical energy band gap of between 1 and 2.7 eV. A further advantage of the a—C:H layers lies in the patternability. In contrast to silicon nitride, the same process can be used for amorphous, hydrogenated carbon as can be used for patterning the subjacent dielectric material (silicon-containing photoresist—$O_2$/RIE).

The unfavorable effect of compressive stress is minimized by the hardness gradient of the a—C:H layers, the region of the a—C:H layer adjoining the plastic layer being softer than its outer region, i.e., having a lower hardness. In this case, the softer region, which consists of polymer-like a—C:H, acts as a stress buffer for the harder region of the a—C:H layer.

Preferably, the a—C:H layers have a hardness gradient of hard-soft-hard. In this case, the region adjoining the plastic layer has a greater hardness than the directly following region. As a result of this bottom, harder region, an intimate bond is achieved between the a—C:H layer and the plastic layer, i.e., this region serves as an adhesive promoter.

The thickness of the a—C:H layers is generally from about 0.1 to 5 μm. Independent of the gradient profile characteristic (soft-hard or hard-soft-hard), the individual layers preferably have the following thickness:
bottom, hard region: 5 to 100 nm
soft region: 100 to 1000 nm
top, hard region: 200 to 4000 nm.

The plastic layers consist generally of polyimide or polybenzoxazole.

To manufacture the multilayer printed circuit boards and multichip-module substrates according to the invention, a thin a—C:H layer, which has a hardness gradient, is deposited on to the plastic layer, i.e., on to the plastic of the layered plastic/conductor composite, by means of high-frequency plasma deposition of gaseous hydrocarbons. Preferably, the plasma deposition takes place by means of radio frequency (RF), i.e.., in the range of between 0.1 and 100 MHz. The deposition can, however, also take place by means of microwaves, i.e., in the range of between 0.1 and 1000 GHz.

As gaseous hydrocarbons, one preferably uses either alkanes, i.e., saturated aliphatic hydrocarbons, such as methane, ethane and propane, or aromatic hydrocarbons, such as benzene and benzene derivatives and, to be specific, in the vaporous state. In addition to that, alkenes and alkynes can be used, such as ethene and propene or acetylene, i.e., unsaturated aliphatic hydrocarbons and, in addition, also cycloalkanes, i.e., saturated cyclic hydrocarbons, such as cyclohexane.

The hardness of the deposited a—C:H layers, i.e., the hardness gradient, is controlled via the high-frequency power or the self-bias voltage. To this end, the following deposition conditions are observed independent of the gradient characteristic:

bottom, hard region: −400 to −1200 V
soft region: −100 to −200 V
top, hard region: −400 to −900 V.

For the deposition of the bottom, hard region of the a—C:H layer serving as an adhesion promoter, one works for a short time under deposition conditions in which high-energy ions are deposited, for example approx. 10 s at about −900 V. The deposition of the middle soft region then takes place at about −150 V, and the deposition of the upper hard region at about −450 V or about −800 V.

Prior to the a—C:H deposition, a surface treatment can advantageously be carried out in an argon or oxygen plasma to further improve adhesion. The argon pretreatment preferably takes place at a self-bias voltage of −500 to −1200 V for 2 to 180 s, the oxygen pretreatment preferably at a self-bias voltage of −500 to −1000 V for 1 to 20 s. The treatment in argon plasma is carried out, for example, at about −900 V for 30 s; the treatment in oxygen plasma, for example, at about −800 V for 10 s.

An apparatus for plasma deposition by means of RF excitation having a parallel plate configuration is used, for example, to manufacture the a—C:H layers. Methane ($CH_4$) is introduced as a reaction gas into this apparatus at a pressure of 0.2 bar. An MCM substrate to be coated is situated on the smaller of the two electrodes (cathode), which is connected via a matching unit to a high-frequency generator (13.56 MHz). The surface relation of the two electrodes (cathode:anode) is smaller than 0.5.

To coat with a—C:H, a deposition power is initially selected—for the duration of 10 s—which produces a self-bias voltage of −900 V; this results in the formation of hard a—C:H. The power is subsequently reduced until a self-bias voltage settles at −150 V. After about 12 min, the layer thickness of the formed, soft a—C:H amounts to about 0.2 µm. The power is then increased to a self-bias voltage of −800 V. At this power, hard a—C:H is deposited once more and, in fact, with a thickness of 0.5 µm within approx. seven minutes. This a—C:H region has a water permeation coefficient of $<1.1\times10^{-13}$ $m^2/s$ and is very impervious to water.

The substrate is expediently pretreated in the same apparatus. To this end, argon or oxygen is introduced at a pressure of 0.2 bar and the plasma is fired, for example, at −800 V; duration: 120 s in the case of argon, 20 s in the case of oxygen. During pretreatment in the argon plasma, the argon flow is stopped without switching off the high-frequency transmitter, and methane is supplied at the same time, the flow being regulated to allow a pressure of 0.2 bar to settle. When one works with an oxygen plasma, the oxygen flow is interrupted after the pretreatment is ended, then one evacuates to about $10^{-3}$ mbar and methane is subsequently introduced at a pressure of 0.2 bar.

What is claimed is:

1. A moisture-resistant layered composite for use as a multilayer printed circuit board or a multichip-module substrate, the layered composite comprising: a layered composite of high-temperature-stable plastic and conductive tracks; and a layer of amorphous, hydrogenated carbon (a—C:H) having a thickness of 0.1 to 5 µm and having a water permeation coefficient of $<1.1\times10^{-13}$ $m^2/s$ and a hardness gradient, the a—C:H layer being situated on the plastic of the plastic/conductor composite.

2. The layered composite according to claim 1, wherein the amorphous, hydrogenated carbon has a layer gradient of hard-soft-hard across it.

* * * * *